United States Patent [19]
Abe et al.

[11] Patent Number: 5,583,094
[45] Date of Patent: Dec. 10, 1996

[54] "METHOD FOR PREPARING HOLLOW OXIDE SUPERCONDUCTORS"

[75] Inventors: Yoshihiro Abe, 6-1705, Higashiyama, Nisshin-cho, Aichi-gun, Aichi-ken; Toshihiro Kasuga; Koichi Nakamura, both of Aichi-ken; Eikichi Inukai, Nagoya, all of Japan

[73] Assignees: Chubu Electric Power Company, Inc.; Yoshihiro Abe; Showa Electric Wire & Cable Co., Ltd., all of, Japan

[21] Appl. No.: 314,505

[22] Filed: Sep. 28, 1994

[30] Foreign Application Priority Data

Sep. 29, 1993 [JP] Japan ................................ 5-243016
Nov. 17, 1993 [JP] Japan ................................ 5-288136

[51] Int. Cl.$^6$ ................................ H01L 39/24
[52] U.S. Cl. ................ 505/430; 505/434; 505/450; 505/452; 505/704; 505/733; 505/739; 427/62
[58] Field of Search ................ 505/430, 434, 505/450, 452, 230, 704, 733, 739; 427/62; 29/599

[56] References Cited

U.S. PATENT DOCUMENTS 5,266,557 11/1993 Abe et al. ................ 505/450

FOREIGN PATENT DOCUMENTS 41309004 6/1992 Germany.
3-46710 2/1991 Japan.
4-366506 12/1992 Japan.

OTHER PUBLICATIONS

Abe et al, J. Mater. Res., 8(1) 1993 pp. 1–4.

*Primary Examiner*—Roy V. King
*Attorney, Agent, or Firm*—Lorusso & Loud

[57] ABSTRACT

A tubular metal pipe and a solidified melt of a precursor of oxide superconducting material which is placed in contact with the metal pipe are subjected to heat treatment in an oxidizing atmosphere and at a temperature above the partial fusion temperature of the solidified melt to oxidize the metal pipe from its inside and outside and, as the oxidation proceeds, a melt of the solidified melt is effused through the tubular metal oxide layer to form a superconducting layer on its surface. This makes it possible to easily obtain a hollow oxide superconductor wherein a superconducting material layer is formed outside the metal oxide layer.

9 Claims, 8 Drawing Sheets

FIG. 13(a)
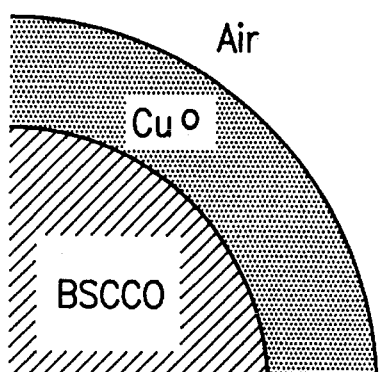
As-Cast
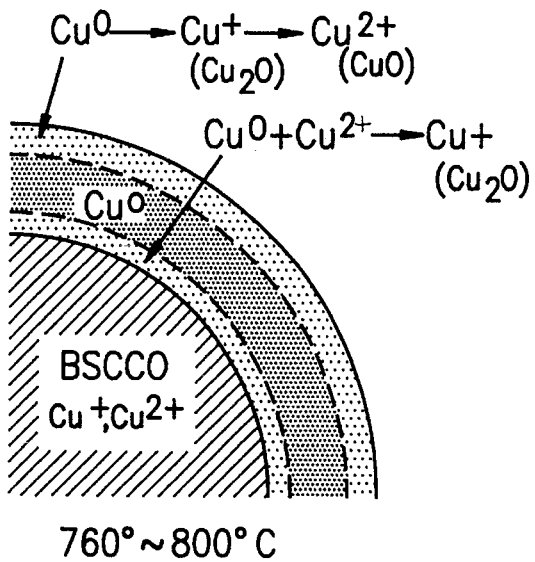
FIG. 13(b) 760°~800° C
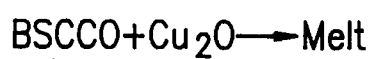
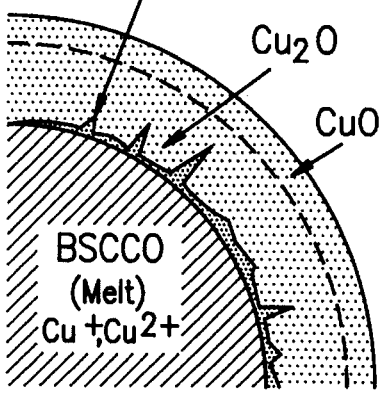
FIG. 13(c)
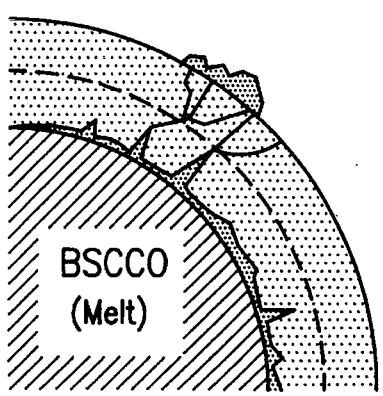
800°~830° C FIG. 13(d)
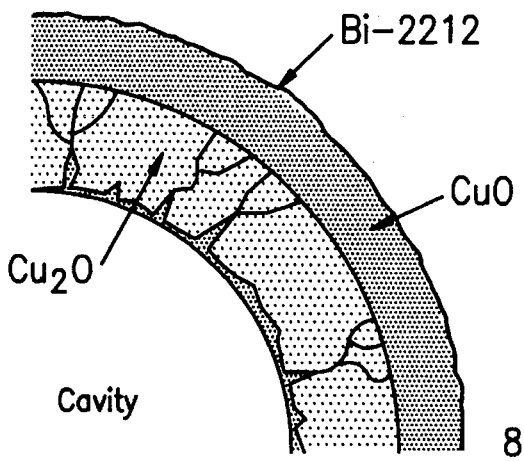
FIG. 13(e)
830°~865° C

"METHOD FOR PREPARING HOLLOW OXIDE SUPERCONDUCTORS"

BACKGROUND OF THE INVENTION

1. Field of the Invention

The present invention relate to oxide superconductors and a process for preparing them. More precisely, the present invention provides oxide superconductors having a structure completely different from those of conventional superconductors and a process for preparing them, wherein an oxide superconductor layer is formed on an oxidized metal layer by heating a solidified melt comprising oxide superconductor precursor to a temperature above the partial fusion temperature so that the solidified melt is effused through a metal tube.

The superconductors of the present invention are suitable for conductors such as hollow coils which may be used as a path for cooling medium.

2. Prior Art

Oxide superconducting materials such as those of the bismuth system have a markedly higher critical temperature (Tc) than metal superconductors such as those of the niobium-titanium system and hence they are economical materials since relatively cheap liquid nitrogen can be used as cooling medium therefor in place of expensive liquid helium. Therefore, practical use of oxide superconductors has been anticipated in various fields including electronics, power transmission and strong magnetic field generation.

Further, their critical current density (Jc) is today nearing a practical level. In order to realize practical use of oxide superconductors on a large scale, it is indispensable to establish techniques for making them into elongated articles, i.e., making them into wires. However, since oxide superconductors are brittle and difficult to process by cutting, it is difficult to make them into wires or coils.

Hitherto, the metal sheath (Ag sheath) method and the organic acid salt method have been known as effective methods for making superconducting wire materials. In the former method, a superconducting wire is manufactured by subjecting a metal tube charged with material powder to a reduction process such as a wire drawing process and rolling process and sintering the tube to grow the material powder into a superconductor. Since the superconductor is covered by the metal tube, it is very easily processed and hence this method is suitable for the production of a wire of long length. In particular, in the case of the bismuth system superconductors, i.e., those of a molar ratio of Bi:Sr:Ca:Cu= 2:2:2:3 (hereinafter referred to as "(2 2 2 3) phase"), a wire having a high Jc can be obtained since the crystal faces are oriented in a single direction by the above-described reduction process. In the latter method, for example, a Bi system oxide superconductor can be produced by dissolving organic metal compounds such as organic acid metal salts and metal alkoxides containing elements which constitute the superconductor, in a predetermined ratio in an organic solvent, applying the solution on a substrate and subjecting it to heat treatment.

However, in order to produce a conductor having an internal hollow which may used as a path for cooling medium by these methods, wire materials including tapes have to be combined with cooling pipes. This makes the production of such composite materials complicated and difficult.

Thus, it is difficult to produce an oxide superconductor having an internal defining a path for liquid nitrogen as is required for application to power equipment, and hence it remains delayed in practical application.

SUMMARY OF THE INVENTION

The present invention seeks to solve the problems of the conventional techniques and to provide oxide superconductors having a structure completely different from the conventional structures and a process for preparing them.

An object of the present invention is to provide superconductors having a path for cooling medium and a process for producing them.

Another object of the present invention is to provide superconductors having a plurality of paths for cooling medium and a process for producing them.

Another object of the present invention is to provide superconductors comprising a tubular metal oxide layer and an oxide superconducting layer formed on the metal oxide layer and a process for producing them.

A further object of the present invention is to provide superconductors comprising a tubular metal layer and a metal oxide layer and an oxide superconducting layer formed on the metal oxide layer and a process for producing them.

The above-described objects of the present invention can be achieved by placing a tubular metal pipe and a solidified melt superconductor precursor in contact with each other and subjecting them to heat treatment in an oxidizing atmosphere at a temperature above the partial fusion temperature of the solidified melt to oxidize the metal pipe while forming an oxide superconductor layer on the metal pipe.

The above process may be carried out by (a) coating the internal surface of the pipe with the solidified melt of superconductor precursor or charging the precursor into the inside of the tube and subjecting the pipe to heat treatment in an oxidizing atmosphere and at a temperature above the partial fusion temperature of the solidified melt to form an oxide superconductor layer outside the tubular metal oxide layer, or (b) placing the solidified melt of superconductor precursor in contact with the outer surface of the tubular metal pipe and subjecting them to heat treatment in an oxidizing atmosphere at a temperature above the partial fusion temperature of the solidified melt to form an oxide superconductor layer inside the tubular metal oxide layer.

In the above processes (a) and (b), bismuth system oxide superconducting materials are preferably used as the precursor of oxide superconducting materials. In particular, a precursor composition having a molar ratio of Bi:Sr:Ca:Cu= 2:2:1:2 (hereinafter referred to as "(2 2 1 2) phase") is preferred. A superconducting material of (2 2 1 2) phase is easily formed by cooling the precursor of the above composition from a temperature above its partial fusion temperature. When copper or a copper alloy is used for the tubular metal pipe, superconducting materials can be similarly formed by using a precursor of a molar ratio Bi:Sr:Ca= 2:2:1 and a melt such as that of the $Bi_2O_3$-SrO-CaO system.

The compositions of the precursors for oxide superconducting materials may vary depending on kind and thickness of the metal pipe, conditions of the heat treatment and the like.

Superconducting materials of a multi-core structure can be easily obtained by using plural metal pipes arranged in a parallel or twisted form.

Further, in the above processes (a) and (b), a part of the metal oxide layer may be enriched with metal components by varying the conditions of the heat treatment. For example, when a copper pipe is used as the metal pipe, a metal oxide layer and an oxide superconductor layer can be successively formed on the outside surface of a substantial tubular copper layer according to the process (a).

In this case, since the tubular copper layer has excellent thermal conductivity and mechanical properties, cooling efficiency is improved when liquid nitrogen is run in contact with the tubular copper layer and mechanical strength of the superconducting material is also improved.

Further, as a result of these improvements, Jc is also increased and direct re-cooling is possible when local heat generation is caused by, for example, skipped flux, and hence destruction of the superconducting material due to quenching is prevented. In other words, the substantial copper layer can function as a stabilizing member.

In the process of the present invention, when the solidified melt of superconductor material is placed in contact with the tubular metal pipe and subjected to heat treatment at a temperature above the partial fusion temperature of the solidified melt in an oxidizing atmosphere, the metal pipe is oxidized from its inside and outside and, as the oxidation progresses, the melt of the superconductor precursor is effused through the tubular metal oxide layer and an oxide superconductor layer is formed on its surface as a result.

BRIEF DESCRIPTION OF THE DRAWINGS

FIGS. 13(a), (b), (c), (d) and (e) show schematic views of a process wherein a superconducting layer is formed on the outside of a copper oxide layer.

DESCRIPTION OF THE PREFERRED EMBODIMENTS

Examples of the present invention are explained hereinafter. The present invention is of course not limited to the following examples.

Figure 1:
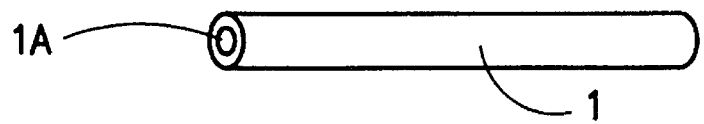
FIG. 1 is a perspective view of ah example of the copper pipe used for the process for preparing the superconductor.
Figure 2:
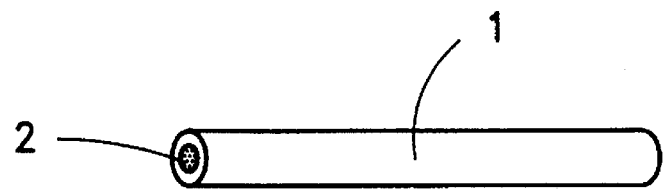
FIG. 2 is a perspective view of the copper pipe of FIG. 1 charged with an oxide superconductor precursor.

Powders of oxides containing elements for forming an oxide superconducting material are mixed in a predetermined molar ratio, for example, in ease of bismuth system superconducting materials, a molar ratio of Bi:Sr:Ca:Cu= 2:2:1:2 or 2:2:2:3, and heated to form a melt. Then, one end of a copper pipe 1 having a lumen 1A shown in FIG. 1 is immersed in the melt and the melt is drawn into the pipe by evacuating air from the other end of the pipe and the composite is then cooled to room temperature. Thus, there is obtained a composite comprising the copper pipe 1 and solidified melt 2 charged in the lumen 1A of the pipe as shown in FIG. 2.

Figure 3:
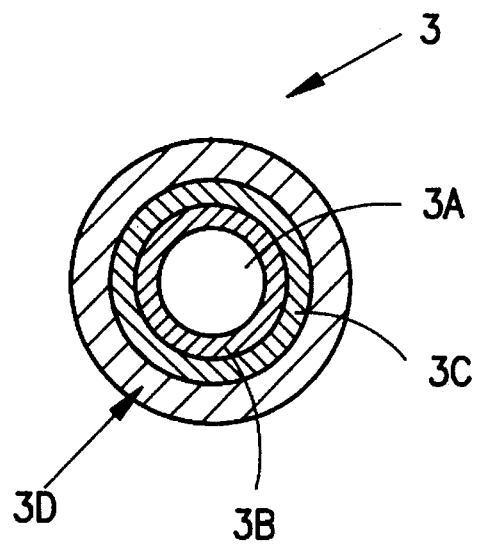
FIG. 3 is a cross-sectional view of a hollow superconductor 3 obtained by heat treatment of the composite shown in FIG. 2.

Then, the composite is heated to a temperature above the partial fusion temperature of the solidified melt 2 in an oxidizing atmosphere such as air and oxygen gas, and is that temperature for a predetermined period and cooled. In case the (2 2 1 2) phase of bismuth system, a temperature range of 800° to 880° C. is suitable as the partial fusion temperature. FIG. 3 is a cross-sectional view of the superconductor 3 having a lumen prepared as described above. In the figure, the diameter of the hollow or lumen 3A of the hollow superconductor 3 is approximately the same as the diameter of the lumen 1A of the copper pipe 1 before the heat treatment. The wall of the hollow superconductor 3 consists of a layer 3B rich in copper, and $Bi_2Sr_2CaCu_2O_x$ superconducting layer 3D is formed on its outside while the copper oxide layer 3C is interposed between them.

By varying the conditions of the heat treatment, for example, by extending the period of the heat treatment, the layer 3B rich in copper can be converted into a copper oxide layer.

Figure 4:
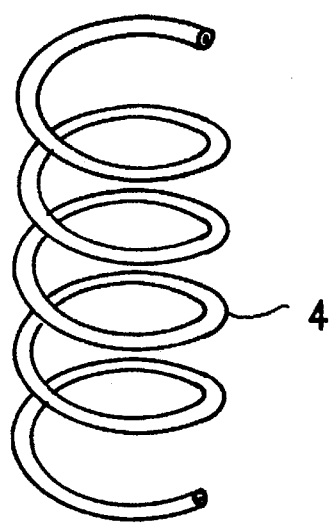
FIG. 4 is a perspective view of an oxide superconductor of the present invention and an example of an oxide superconductor in the shape of a coil 4 prepared by the process of the present invention.

FIG. 4 shows an oxide superconductor 4 formed in the shape of a coil, which is prepared by a process basically the same as that used to form the above-described hollow superconductor 3. That is, the coil-shaped oxide superconductor 4 is obtained by charging a melt of oxide superconductor precursor into a pipe composed of copper, copper alloy or the like preliminarily formed in the shape of a coil, cooling it and subjecting it to heat treatment in an oxidizing atmosphere.

Figure 5:
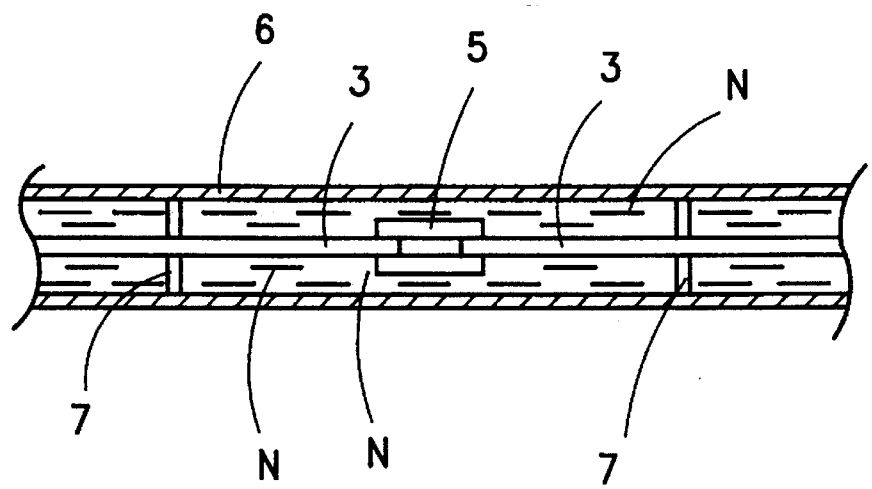
FIG. 5 is a cross-sectional view of an example of a superconducting mother wire including the the hollow superconductor 3 of FIG. 3 and a joint member 5.

FIG. 5 is a cross-sectional view of a superconducting mother wire constituted by a plurality of the hollow superconductors 3 prepared by the method shown in FIG. 3 and connected by a Joint member 5. To enable the plural hollow superconductors 3 to function as a superconducting mother wire, the hollow superconductors 3 are placed in the inside of a tube body 6, supporting members 7 are placed at necessary points to support the hollow superconductors 3 and the inside of the tube body 6 is filled with liquid nitrogen N to cool the hollow superconductor 3 as shown in FIG. 5. In this case, of course, liquid nitrogen may also be supplied to the inside of the hollow superconductors 3 by compression.

Figure 6:
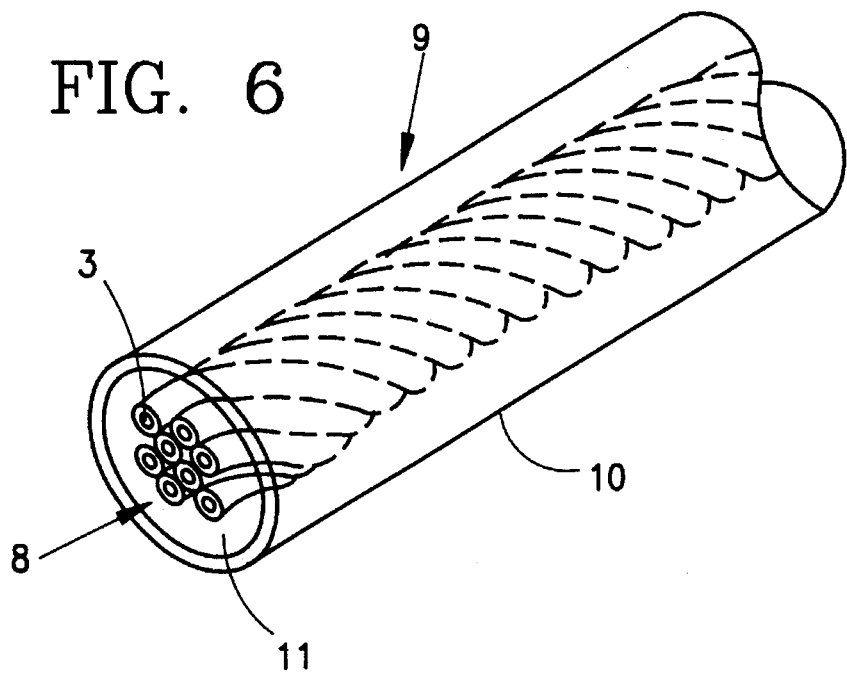
FIG. 6 is a perspective view of an example of a superconducting cable 9 in accordance with the present invention using a superconductor 8 of the internal cooling type with a multi-core structure.

FIG. 6 shows an example of a superconductor cable 9 using a superconductor 8 of internal cooling type having a multi-core structure. As shown in this figure, the superconductor 8 of the internal cooling type used in the superconducting cable 9, which comprises a plurality of hollow superconductors 3 twisted together, is placed in a sheath 10, which serves as a mechanical protection layer, and the space between the sheath 10 and the superconductor 8 of internal cooling type is filled with insulating material 11 comprising a synthetic resin such as an epoxy resin or a synthetic rubber such as EPR.

The above-described superconductor 8 of the internal cooling type is obtained by charging a plurality of copper pipes, preliminarily twisted together, with a melt of oxide superconductor precursor, cooling them, subjecting them to heat treatment in an oxidizing atmosphere, placing them in the sheath 10 and charging the insulating material 11 between the sheath 10 and the superconductor 8.

Figure 7:
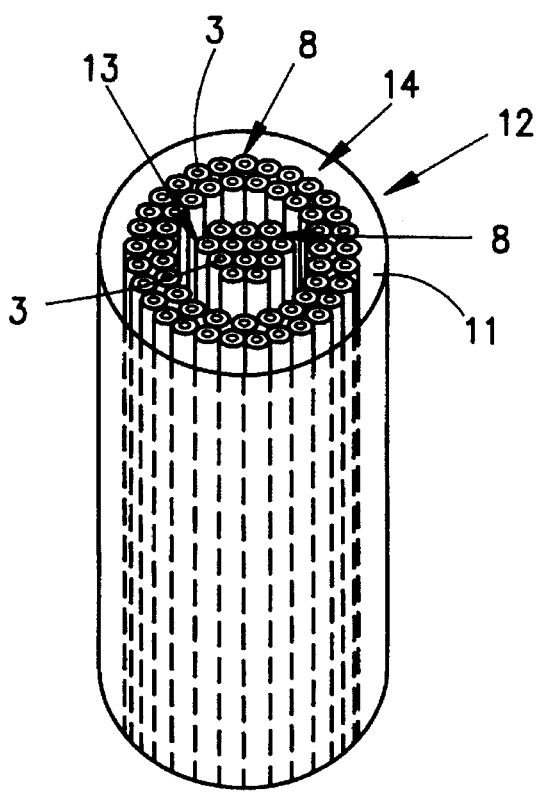
FIG. 7 is a perspective view of an example of a coaxial current lead 12 of the self-magnetic field offset type, in accordance with the present invention, having a superconductor 8 of internal cooling type having a multi-core structure.
Figure 8:
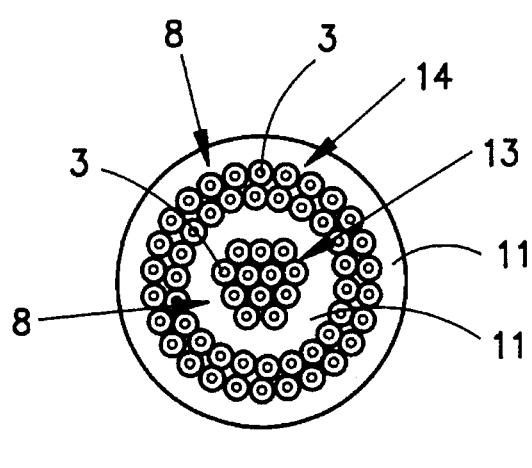
FIG. 8 is a cross-sectional view of the coaxial current lead 12 of the self-magnetic field offset type shown in FIG. 7.

FIGS. 7 and 8 show a coaxial current lead 12 of the self-magnetic field offset type utilizing the internal cooling superconductor 8. The current lead 12 comprises a current conducting part comprising a central conductive part 13 and an outer conductive part 14 and insulating material 11 comprising a synthetic resin such as an epoxy resin or a synthetic rubber such as EPR, and the superconductors 8 are used for the central conductive part 13 and the outer conductive part 14.

The above-described current lead 12 is obtained by preliminarily arranging plural copper pipes coaxially, charging the copper pipes with a melt of oxide superconductor precursor, cooling them, subjecting them to heat treatment in an oxidizing atmosphere, placing them in a sheath (not shown) and filling the spaces between the sheath and the outer conductive part 14 and between the central conductive part 13 and the outer conductive part 14 with insulating material 11. In the current lead 12, when a current is conducted, because the current values in the central conductive part 13 and the outer conductive part 14 are the same and their current directions are opposite, the self-magnetic fields are offset and hence Jc is increased. Further, when the current lead 12 is used as an AC cable, its inductance becomes 0. Therefore, insulating design is easy and transmitting current density is improved.

EXAMPLE 1

Powders of $Bi_2O_3$, $SrCO_3$, $CaCO_3$ and $CuO$ were weighed and mixed to obtain an oxide molar ratio of $Bi_2O_3$:$SrO$:$CaO$:$CuO$=1:2:1:2. These oxide powders were mixed and placed in a platinum crucible and heated in an electric furnace maintained at a temperature of 1000° to 1400° C. to form a melt. The melt was drawn into a copper pipe having an internal diameter of 2 mm, a wall thickness of 0.4 mm and a length of 1 m and allowed to cool at room temperature. After closing both ends of the pipe by pressing, the pipe was heated in air at a temperature increasing rate of 5° C./min and maintained at temperatures between 830° to 865° C. for 50 hours and allowed to cool in the furnace.

In order to investigate the mechanism of formation of the thus prepared hollow superconductor, the material was observed with a scanning electron microscope (SEM) and analyzed with an energy dispersed X-ray microanalyzer (EDX) in the middle of the heat treatment.

Further, with respect to the superconductor after the heat treatment, the material was identified by X-ray diffraction analysis and Tc was determined by measuring its electric resistance.

Figure 9:
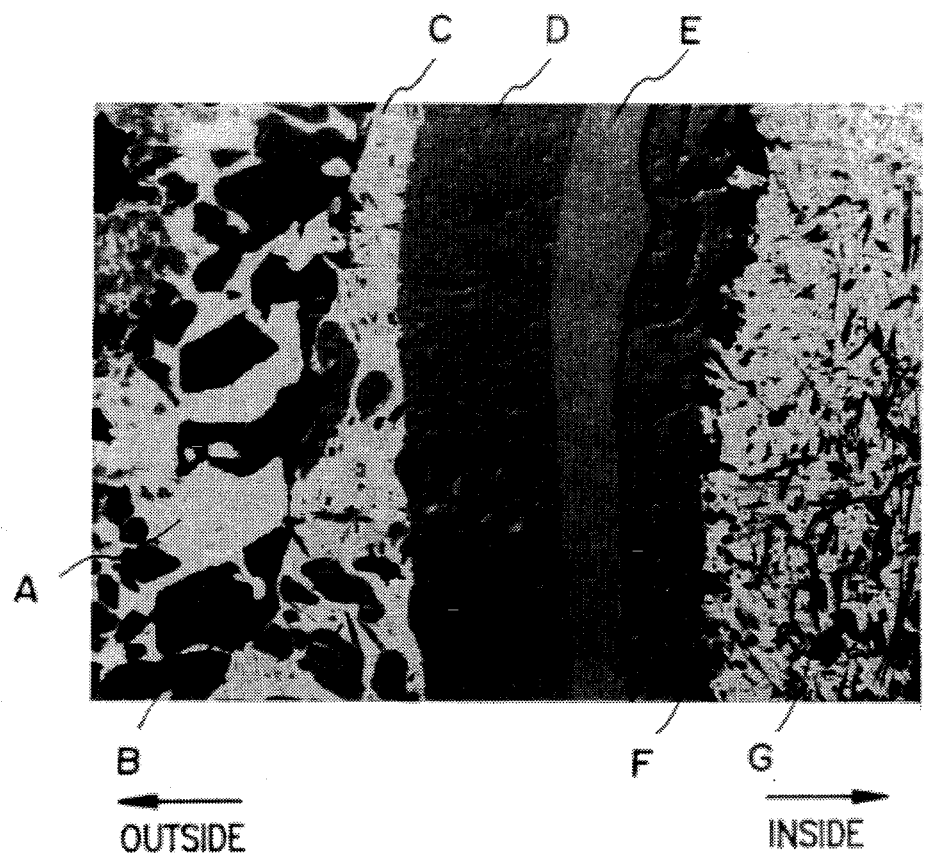
FIG. 9 shows a SEM image obtained after heat treatment for a short period in air.

FIG. 9 shows an SEM image of the material which underwent heat treatment in air at a temperature of 840° C. for 24 hours. In this figure, the cross-section of the hollow tube body presents a multi-layer structure, i.e., a 7-layer structure comprising layers A to G from the outside of the tube body. Among these layers, it was found by EDX analysis that A, C and G have a composition of the (2 2 1 2) phase, B, D and F have a composition of CuO phase and E is composed of Cu.

Therefore, it is assumed that, in the middle of the heat treatment, a mixed layer of the (2 2 1 2) phase and the CuO phase was formed on a CuO layer outside the Cu layer which had not been oxidized yet, while the (2 2 1 2) layer remained on the CuO layer inside the Cu layer.

FIG. 10(a), (b) and (c) represent X-ray diffraction charts of the materials subjected to the heat treatment in air for 50 hours at temperatures of 830° C., 850° C. and 865° C., respectively. The samples were obtained by slicing the hollow tube bodies along cross-sectional planes perpendicular to the axis of the bodies and making the sliced bodies into powders and hence they contained the inside copper oxide layer. High peak values of CuO or $Cu_2O$ phase are recognized, but it is clear that the (2 2 1 2) phase was formed at each of the temperatures and the hollow bodies show, as described hereinafter, superconducting properties.

Figure 11A:
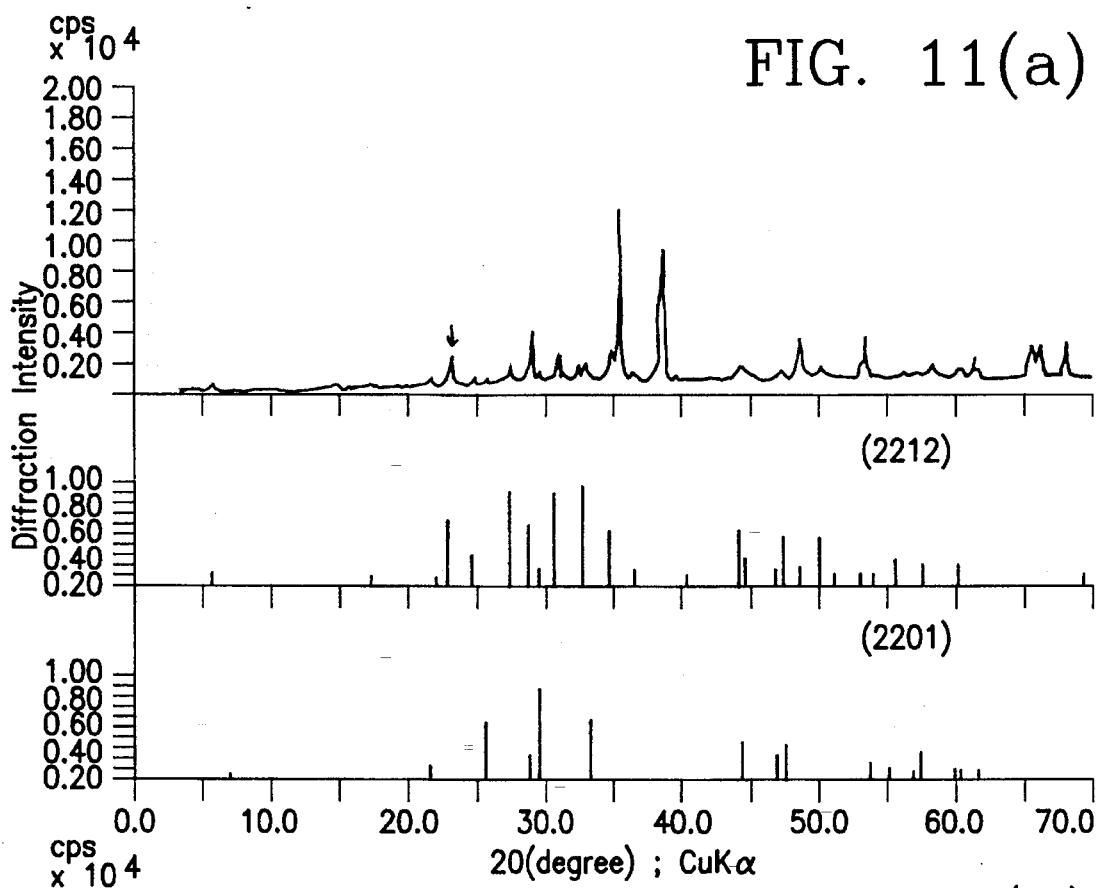
FIGS. 11(a) and (b) show a series of X-ray diffraction charts with respect to samples of a superficial part obtained after 2-step heat treatment in air.
Figure 11B:
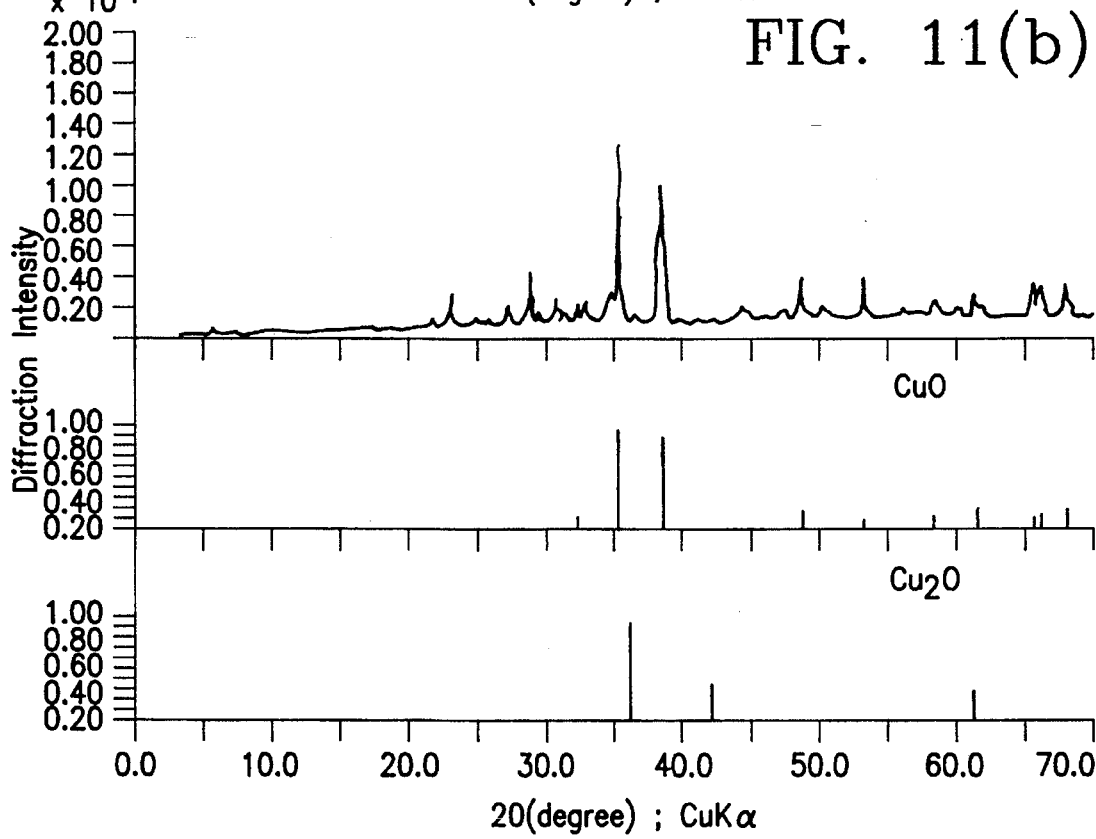

FIG. 11 represents X-ray diffraction charts of the materials subjected to the heat treatment in air at a temperature of 865° C. for 24 hours and 840° C. for 50 hours. The samples were obtained from the surface of the hollow tube bodies and they were made into powder.

In this case, as seen from (a) and (b) of the figure, more than about 90% of the superconductive layer is composed of the (2 2 1 2) phase and it is considered that most of the oxide is composed of CuO.

It is considered that the above results were obtained because, as the period of the heat treatment was prolonged, the copper pipe was oxidized in the order of $Cu \rightarrow Cu_2O \rightarrow CuO$ and the melted part of the precursor having the composition of (2 2 1 2) in the inside of the copper pipe was effused to the outside to form the (2 2 1 2) phase. This effusion of the melted part of the precursor to the outside was also observed by continuous video tape recording images.

Figure 10:
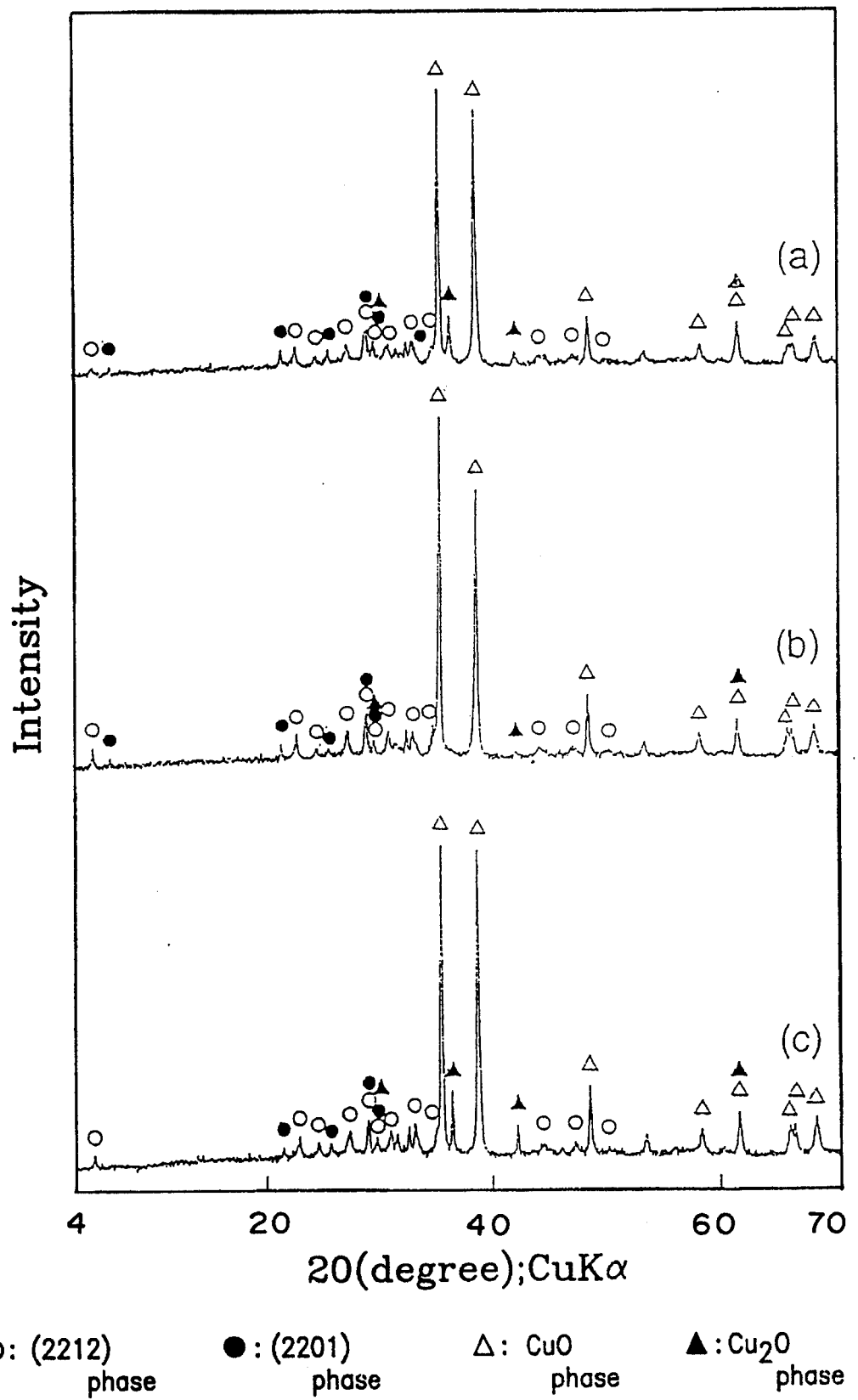
FIGS. 10(a), (b) and (c) show a series of X-ray diffraction spectra obtained after heat treatments at various temperatures in air for a predetermined period.
Figure 12:
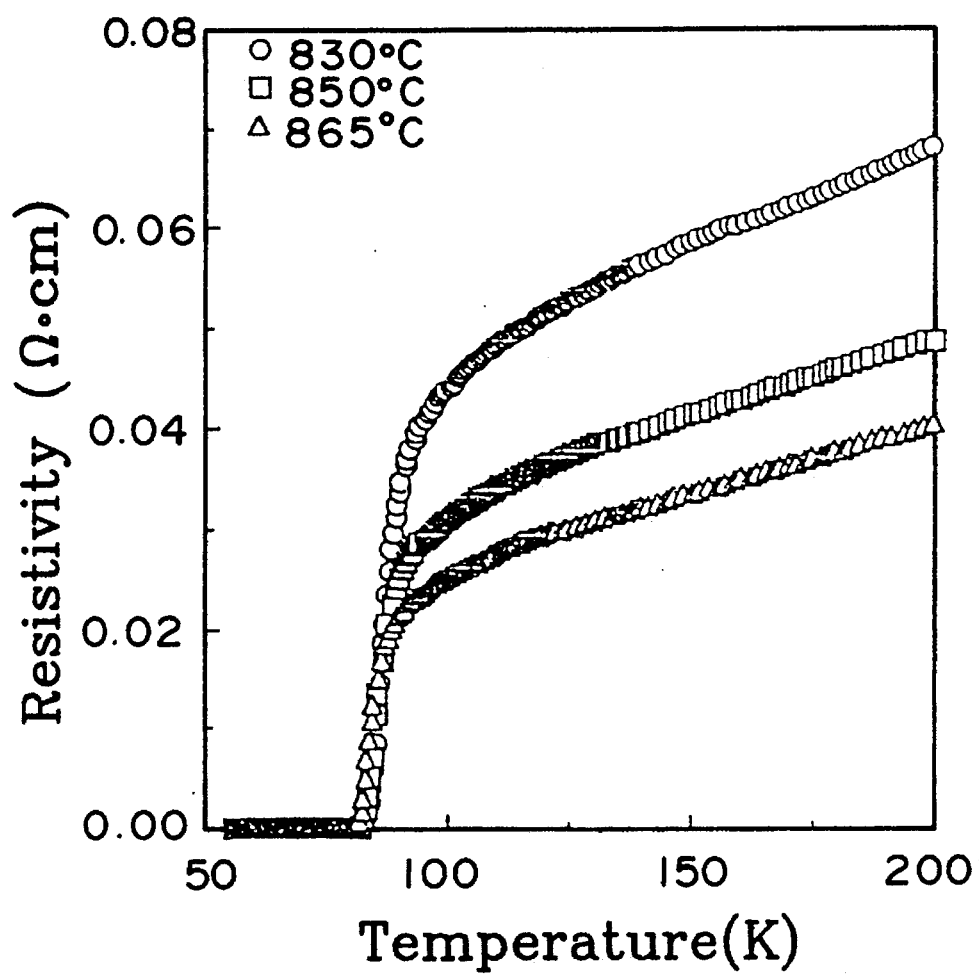
FIG. 12 shows specific resistance-temperature curves.

The properties of the hollow superconductors obtained by the heat treatment shown in FIG. 10 were determined and they were found to have the values of Tc=about 80K and Jc=about 80 A/cm$^2$ (77 k) when the external magnetic field was 0. The specific resistance-temperature curves are shown in FIG. 12.

Similar results were obtained when the heat treatment was carried out under an oxygen gas flow, but the phenomena described above could not be observed under an argon gas flow or a nitrogen gas flow and it was impossible to obtain a superconductor.

It is considered that the process where the copper pipe is oxidized by the heat treatment in air at a temperature above the partial fusion temperature while a superconducting layer is formed on the outside of the copper oxide layer is as illustrated in FIG. 13.

Because the melt drawn into the copper pipe is rapidly cooled, it is assumed that the ratio of monovalent cuprous ions and divalent cupric ions in the solidified melt is about 1:1. In this case, the partial fusion temperature is lowered due to the presence of the monovalent cuprous ions. When the internal pressure is elevated by the heating to a temperature above the partial fusion temperature, the copper pipe is eroded from its inside and experiences changes such as oxidation of copper metal and generation of coarse crystalline particles. As a result, intergranular corrosion, erosion of etch pit and the like are accelerated and micropores are generated. Through these micropores, the melt in the inside is effused to the outside in accordance with a mechanism similar to capillary action and the effused melt covers the whole surface of the copper pipe. During this process, the copper pipe is oxidized from its outside by the heating in air and, accordingly, a superconducting layer is formed on the surface of the copper oxide.

FIG. 13 schematically represents processes where the temperature is continuously elevated and it shows that the above-described phenomena proceed as the temperature is elevated.

EXAMPLE 2

Powders of $Bi_2O_3$, PbO, SrO, CaO and CuO were weighed so and mixed to provide an oxide molar ratio of $Bi_2O_3$: PbO:SrO:CaO:CuO=0.8:0.4:2:2:3. These oxide powders were placed in a platinum crucible and heated in an electric furnace maintained at a temperature of 1000° to 1400° C. to form a melt. The melt was drawn into a copper pipe in a manner similar to Example 1 and allowed to cool at room temperature. Then, the pipe was heated to a temperature of 840° C. in air, maintained at that temperature for 250 hours and allowed to cool at room temperature.

In this case, a $Bi_2Sr_2Ca_2Cu_3O_x$ superconducting layer was formed on the outside of the copper oxide layer and its properties were determined. It had values of Tc=about 105K and Jc=about 120 A/cm$^2$ (77 k) when the external magnetic field was 0.

What is claimed is:

1. A process for preparing oxide superconductors which comprises:

charging a melt of a superconducting oxide precursor into a metal pipe or coating the melt on the internal surface of the pipe, cooling the melt and the pipe to form a cylindrical composite of said metal pipe and solidified melt subjecting the composite to heat treatment in an oxidizing atmosphere and at a temperature above the partial fusion temperature of the solidified melt to oxidize the pipe to form a tubular metal oxide structure having a lumen, and to cause said solidified melt to effuse through the tubular metal oxide structure and to form an oxide superconducting layer on the exterior of the thus formed tubular metal oxide structure.

2. A process for preparing oxide superconductors which comprises:

placing a melt of a superconducting oxide precursor around the exterior of at least one tubular metal pipe, cooling the melt and the pipe to form a cylindrical composite of said metal pipe and solidified melt, and heating the composite in an oxidizing atmosphere and at a temperature above the partial fusion temperature of the solidified melt to oxidize the pipe to form a tubular metal oxide structure having a lumen and to cause said solidified melt to effuse through the tubular metal oxide structure and to form a superconducting oxide layer inside the tubular metal oxide structure.

3. The process for preparing oxide superconductors according to claim 1, wherein the tubular metal pipe comprises copper or a copper alloy.

4. The process for preparing oxide superconductors according to claim 3, wherein the melt of superconducting oxide precursor comprises at least bismuth, strontium, calcium and oxygen.

5. The process for preparing oxide superconductors according to claim 4, wherein said bismuth, strontium and calcium are present in a molar ratio of about 2:2:1.

6. The process for preparing oxide superconductors according to claim 1, wherein said melt is placed around plural tubular metal pipes.

7. The process for preparing oxide superconductors according to claim 6, wherein said plural tubular metal pipes are contained in a sheath.

8. The process for preparing oxide superconductors according to claim 1, wherein said heat treatment is carried out at a temperature of from 800° to 880° C.

9. A process for preparing oxide superconductors which comprises:

charging a melt of a superconductor oxide precursor comprising at least bismuth, strontium, calcium and oxygen, in a molar ratio of about 2:2:1, into a metal pipe or coating the melt on the internal surface of the pipe, cooling the melt and the pipe to form a composite of said metal pipe and solidified melt, heating the composite in an oxidizing atmosphere and at a temperature of from 800° to 880° C. for more than 30 hours to oxidize the pipe to form a tubular metal oxide structure, to provide a lumen in the pipe and to cause said solidified melt to effuse through the tubular metal oxide structure and to form a bismuth-based system superconducting layer on the exterior of the tubular metal oxide structure.

* * * * *

UNITED STATES PATENT AND TRADEMARK OFFICE
CERTIFICATE OF CORRECTION

PATENT NO. : 5,583,094
DATED : December 10, 1996
INVENTOR(S) : ABE et al

It is certified that error appears in the above-indentified patent and that said Letters Patent is hereby corrected as shown below:

Col. 3, line 28, "ah" should read --an--.
Col. 4, line 9, "ease" should read --case--;
        line 20, after "is" insert --maintained at--;
        line 50, "Joint" should read --joint--.
Col. 6, line 40, "'77" should read --(77--.
Col. 8, line 43, delete "system".

Signed and Sealed this

Twenty-third Day of September, 1997

Attest:

BRUCE LEHMAN

Attesting Officer   Commissioner of Patents and Trademarks